United States Patent
Schmalbuch et al.

(10) Patent No.: US 9,496,632 B2
(45) Date of Patent: Nov. 15, 2016

(54) DISK HAVING AN ELECTRICAL CONNECTION ELEMENT

(71) Applicant: Saint-Gobain Glass France, Courbevoie (FR)

(72) Inventors: Klaus Schmalbuch, Aachen (DE); Bernhard Reul, Herzogenrath (DE); Lothar Lesmeister, Landgraaf (NL); Mitja Rateiczak, Wuerselen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/400,476

(22) PCT Filed: May 16, 2013

(86) PCT No.: PCT/EP2013/060116
§ 371 (c)(1),
(2) Date: Nov. 11, 2014

(87) PCT Pub. No.: WO2013/182394
PCT Pub. Date: Dec. 12, 2013

(65) Prior Publication Data
US 2015/0162677 A1 Jun. 11, 2015

(30) Foreign Application Priority Data

Jun. 6, 2012 (EP) ..................... 12171029

(51) Int. Cl.
*H05B 3/00* (2006.01)
*H01R 12/57* (2011.01)
(Continued)

(52) U.S. Cl.
CPC .............. *H01R 12/57* (2013.01); *B23K 1/002* (2013.01); *B23K 1/0004* (2013.01); *B23K 1/005* (2013.01);
(Continued)

(58) Field of Classification Search
CPC ......... H01R 4/05; H01R 11/10; H01R 11/11; H01R 13/03; H01R 13/22; H01R 13/111; H01R 12/707; H01R 12/57; H01R 12/718; H01R 43/02; H01R 43/0235; H01R 2101/00; H05B 3/84; H05B 2203/016; B23K 35/262; B23K 35/264; B23K 35/0222; B23K 35/3006; B23K 35/0238; B23K 1/0016; B23K 1/0004; B23K 1/002; B23K 1/0058; B23K 1/012; B23K 2001/12; B23K 2201/36; B23K 2201/12; B32B 15/01; C22C 12/00; C22C 13/00; C22C 38/04; C22C 38/26; C22C 38/28; H05K 1/111

See application file for complete search history.

(56) References Cited

U.S. PATENT DOCUMENTS 2,644,066 A 6/1953 Glynn
2,709,211 A 5/1955 Glynn
(Continued)

FOREIGN PATENT DOCUMENTS

EP 0593940 4/1994
EP 2365730 9/2011
(Continued)

OTHER PUBLICATIONS

Written Opinion mailed on Jun. 27, 2013 for PCT/EP2013/060116 filed on May 16, 2013 in the name of Saint-Gobain Glass France.
(Continued)

*Primary Examiner* — Shawntina Fuqua
(74) *Attorney, Agent, or Firm* — Steinfl & Bruno LLP

(57) ABSTRACT

A pane with at least one electrical connection element, having: a substrate, an electrically conductive structure on a region of the substrate, a connection element that is implemented as a snap and contains at least one chromium-containing steel, and a layer of a soldering compound, which electrically connects the connection element to a subregion of the electrically conductive structure.

20 Claims, 2 Drawing Sheets

Figure 1:
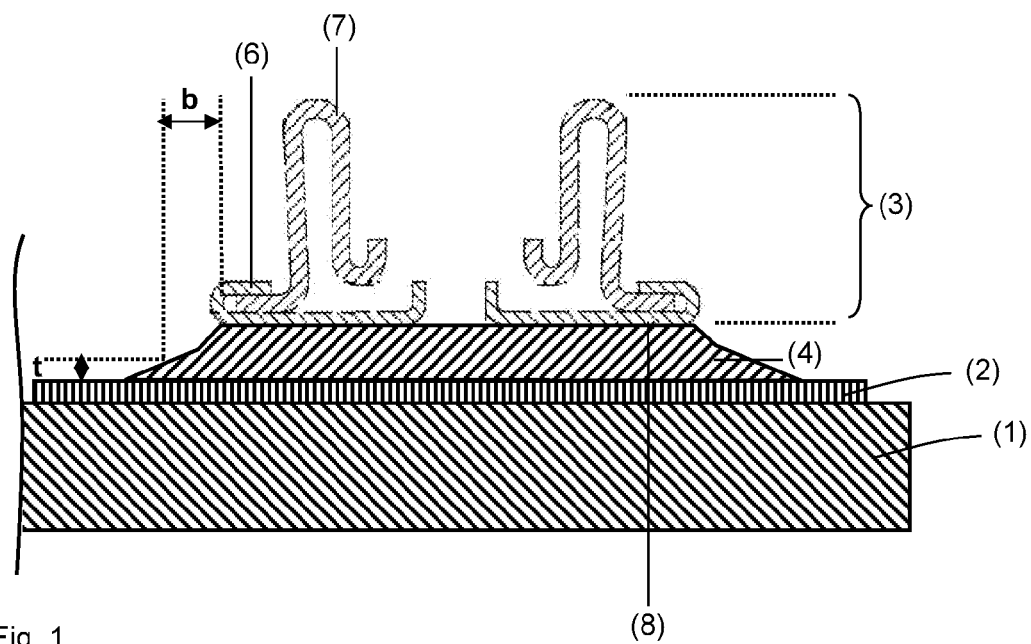

(51) Int. Cl.
*H01R 13/03* (2006.01)
*B23K 1/00* (2006.01)
*B23K 1/002* (2006.01)
*B23K 1/005* (2006.01)
*B23K 1/012* (2006.01)
*B23K 35/30* (2006.01)
*B23K 35/02* (2006.01)
*C22C 12/00* (2006.01)
*C22C 38/04* (2006.01)
*C22C 38/26* (2006.01)
*C22C 38/28* (2006.01)
*H01R 4/02* (2006.01)
*H01R 12/71* (2011.01)
*H01R 43/02* (2006.01)
*H05K 1/11* (2006.01)
*H01R 13/11* (2006.01)
*H01R 101/00* (2006.01)

(52) U.S. Cl.
CPC ............ *B23K 1/0016* (2013.01); *B23K 1/012* (2013.01); *B23K 35/0222* (2013.01); *B23K 35/0238* (2013.01); *B23K 35/3006* (2013.01); *C22C 12/00* (2013.01); *C22C 38/04* (2013.01); *C22C 38/26* (2013.01); *C22C 38/28* (2013.01); *H01R 4/02* (2013.01); *H01R 12/718* (2013.01); *H01R 13/03* (2013.01); *H01R 43/02* (2013.01); *H01R 43/0235* (2013.01); *H05K 1/111* (2013.01); *B23K 2001/12* (2013.01); *B23K 2201/36* (2013.01); *H01R 13/111* (2013.01); *H01R 2101/00* (2013.01); *H05B 2203/016* (2013.01)

(56) References Cited

U.S. PATENT DOCUMENTS

| | | | |
|---|---|---|---|
| 3,946,730 A | 3/1976 | Monter | |
| 4,126,126 A | 11/1978 | Bare et al. | |
| 6,249,966 B1 | 6/2001 | Pereira et al. | |
| 6,638,120 B2 | 10/2003 | Costa | |
| 8,816,214 B2 | 8/2014 | Ziegler et al. | |
| 8,816,215 B2 | 8/2014 | Reul et al. | |
| 2002/0111081 A1 | 8/2002 | Machado | |
| 2003/0030064 A1 | 2/2003 | Takano et al. | |
| 2003/0162415 A1 | 8/2003 | Spaulding et al. | |
| 2006/0102610 A1 | 5/2006 | Hoepfner et al. | |
| 2007/0105412 A1 | 5/2007 | Hoepfner et al. | |
| 2007/0224842 A1* | 9/2007 | Hoepfner ................ | H01R 4/02 439/34 |
| 2010/0321758 A1* | 12/2010 | Bugno .................... | B60R 1/088 359/267 |
| 2011/0056589 A1 | 3/2011 | De Boer et al. | |

FOREIGN PATENT DOCUMENTS

| | | |
|---|---|---|
| EP | 2408260 | 1/2012 |
| JP | S50041366 A | 4/1975 |
| JP | S5314988 A | 2/1978 |
| JP | S5678170 U | 6/1981 |
| JP | H0696847 A | 4/1994 |
| JP | 2001203020 A | 7/2001 |
| KR | 20080063712 A1 | 2/2004 |
| WO | 2004/012302 A1 | 2/2004 |
| WO | 2006/098160 A1 | 9/2006 |
| WO | 2006/132319 A1 | 12/2006 |
| WO | 2009/135469 A1 | 11/2009 |

OTHER PUBLICATIONS

International Preliminary Report on Patentability issued on Dec. 9, 2014 for PCT/EP2013/060116 filed on May 16, 2013 in the name of Saint-Gobain Glass France.

International Search Report mailed on Jun. 27, 2014 for PCT/EP2013/060116 filed on May 16, 2014 in the name of Saint-Gobain Glass France.

8.1.7 Wärmeausdehnugh In: Menges Georg, Haberstroh Edmund, Michaeli Walter, Schmachtenberg Ernst: "W erkstoffkunde Kunststoffe", 2002, Carl Hanser Verlag München Wien,, XP002686076, ISVN: 978-3-446-21257-2 p. 257—German with English Translation.

* cited by examiner

DISK HAVING AN ELECTRICAL CONNECTION ELEMENT

CROSS REFERENCE TO RELATED APPLICATIONS

The present application is the US national stage of International Patent Application PCT/EP2013/060116 filed on May 16, 2013 which, in turn, claims priority to European application 12171029.7 filed on June 6, 2012.

The invention relates to a pane with an electrical connection element and an economical and environmentally friendly method for its production.

The invention further relates to a pane with an electrical connection element for motor vehicles with electrically conductive structures such as, for instance, heating conductors or antenna conductors. The electrically conductive structures are customarily connected to the onboard electrical system via soldered-on electrical connection elements. Due to different coefficients of thermal expansion of the materials used, mechanical stresses occur that strain the panes and can cause breakage of the pane during production and operation.

Lead-containing solders have high ductility that can compensate the mechanical stresses occurring between an electrical connection element and the pane by plastic deformation. However, because of the End of Life Vehicles Directive 2000/53/EC, lead-containing solders have to be replaced by lead-free solders within the EC. The directive is referred to, in summary, by the acronym ELV (End of Life Vehicles). Its objective is, as a result of the massive increase in disposable electronics, to ban extremely problematic components from products. The substances affected are lead, mercury, and cadmium. This relates, among other things, to the implementation of lead-free soldering materials in electrical applications on glass and the introduction of corresponding replacement products.

Electrical connection elements that are designed in the form of a snap are known, for example, from, U.S. Pat. No. 6,249,966 B1 and US 20070224842 A1. Such connection elements enable a convenient connection to the onboard electrical system. US 20070224842 A1 proposes making the connection element from titanium. However, titanium is difficult to solder. This results in poor adhesion of the connection element on the pane. Titanium is also very expensive, which results in a high price for the connection element.

The object of the present invention is to provide a pane with an electrical connection element and an economical and environmentally friendly method for its production, whereby critical mechanical stresses in the pane are avoided.

The object of the present invention is, further, to provide an improved material for the connection element compared to the prior art, having better availability and better processability, such as solderability and cold formability.

The object of the present invention is accomplished according to the invention by a device according to independent claim 1. Preferred embodiments emerge from the subclaims.

The pane according to the invention with at least one connection element comprises the following characteristics:
- a substrate,
- an electrically conductive structure on a region of the substrate,
- a connection element that is implemented as a snap and contains at least one chromium-containing steel, and
- a layer of a soldering compound, which electrically connects the connection element to a subregion of the electrically conductive structure.

The substrate preferably contains glass, particularly preferably, flat glass, float glass, quartz glass, borosilicate glass, soda lime glass. In an alternative preferred embodiment, the substrate contains polymers, particularly preferably, polyethylene, polypropylene, polycarbonate, polymethyl methacrylate, and/or mixtures thereof.

The substrate has a first coefficient of thermal expansion. The connection element has a second coefficient of thermal expansion. In an advantageous embodiment of the invention, the difference between the first and the second coefficient of thermal expansion is $<5\times10^{-6}/°$ C. Because of this, better adhesion is obtained.

An electrically conductive structure is applied on the pane. An electrical connection element is electrically connected on subregions to the electrically conductive structure by a soldering compound. The soldering compound flows out with an outflow width of <1 mm from the intermediate space between the connection element and the electrically conductive structure.

In a preferred embodiment, the maximum outflow width is preferably less than 0.5 mm and, in particular, roughly 0 mm. This is particularly advantageous with regard to the reduction of mechanical stresses in the pane, the adhesion of the connection element, and the reduction in the amount of solder.

The maximum outflow width is defined as the distance between the outer edges of the connection element and the point of the soldering compound crossover, at which the soldering compound drops below a layer thickness of 50 μm. The maximum outflow width is measured on the solidified soldering compound after the soldering process.

A desired maximum outflow width is obtained through a suitable selection of soldering compound volume and vertical distance between the connection element and the electrically conductive structure, which can be determined by simple experiments. The vertical distance between the connection element and the electrically conductive structure can be predefined by an appropriate process tool, for example, a tool with an integrated spacer.

The maximum outflow width can even be negative, i.e., pulled back into the intermediate space formed by an electrical connection element and an electrically conductive structure.

In an advantageous embodiment of the pane according to the invention, the maximum outflow width is pulled back in a concave meniscus into the intermediate space formed by the electrical connection element and the electrically conductive structure. A concave meniscus is created, for example, by increasing the vertical distance between the spacer and the conductive structure during the soldering process, while the solder is still fluid.

The advantage resides in the reduction of mechanical stresses in the pane, in particular, in the critical region present with a large soldering compound crossover.

The first coefficient of thermal expansion is preferably from $8\times10^{-6}/°$ C. to $9\times10^{-6}/°$ C. The substrate is preferably glass that has, preferably, a coefficient of thermal expansion from $8.3\times10^{-6}/°$ C. to $9\times10^{-6}/°$ C. in a temperature range from 0° C. to 300° C.

The second coefficient of thermal expansion is preferably from $9\times10^{-6}/°$ C. to $13\times10^{-6}/°$ C., particularly preferably from $10\times10^{-6}/°$ C. to $11.5\times10^{-6}/°$ C. in a temperature range from 0° C. to 300° C.

The electrically conductive structure according to the invention has, preferably, a layer thickness of 5 μm to 40 μm, particularly preferably from 5 μm to 20 μm, very particularly preferably, from 8 μm to 15 μm, and, most particularly, from 10 μm to 12 μm. The electrically conductive structure according to the invention preferably contains silver, particularly preferably, silver particles and glass frits.

The layer thickness of the solder is less than or equal to $6.0 \times 10^{-4}$ m, particularly preferably less than $3.0 \times 10^{-4}$ m.

The soldering compound is preferably leadfree. In the context of the invention, "leadfree soldering compound" means a soldering compound that contains, in accordance with EC Directive "2002/95/EC on the Restriction of the Use of Certain Hazardous Substances in Electrical and Electronic Equipment", a lead proportion less than or equal to 0.1 wt.-%, preferably no lead. This is particularly advantageous with regard to the environmental impact of the pane with an electrical connection element according to the invention.

Leadfree soldering compounds typically have less ductility than lead-containing soldering compounds, such that mechanical stresses between a connection element and a pane can be less well compensated. However, it has been demonstrated that critical mechanical stresses can be avoided by means of the connection element according to the invention. The soldering compound according to the invention contains, preferably, tin and bismuth, indium, zinc, copper, silver, or compositions thereof. The proportion of tin in the solder composition according to the invention is from 3 wt.-% to 99.5 wt.-%, preferably from 10 wt.-% to 95.5 wt.-%, particularly preferably from 15 wt.-% to 60 wt.-%. The proportion of bismuth, indium, zinc, copper, silver, or compositions thereof in the solder composition according to the invention is from 0.5 wt.-% to 97 wt.-%, preferably 10 wt.-% to 67 wt.-%, whereby the proportion of bismuth, indium, zinc, copper, or silver can be 0 wt.-%. The solder composition according to the invention can contain nickel, germanium, aluminum, or phosphorus at a proportion of 0 wt.-% to 5 wt.-%. The solder composition according to the invention contains, very particularly preferably, Bi40Sn57Ag3, Sn40Bi57Ag3, Bi59Sn40Ag1, Bi57Sn42Ag1, In97Ag3, Sn95.5Ag3.8Cu0.7, Bi67In33, Bi33In50Sn17, Sn77.2In20Ag2.8, Sn95Ag4Cu1, Sn99Cu1, Sn96.5Ag3.5, Sn96.5Ag3Cu0.5, Sn97Ag3, or mixtures thereof.

In an advantageous embodiment, the soldering compound contains bismuth. It has been demonstrated that a bismuth-containing soldering compound results in particularly good adhesion of the connection element according to the invention to the pane, by means of which damage to the pane can be avoided. The proportion of bismuth in the soldering compound composition is preferably from 0.5 wt.-% to 97 wt.-%, preferably 10 wt.-% to 67 wt.-%, and very particularly preferably from 33 wt.-% to 67 wt.-%, in particular from 50 wt.-% to 60 wt.-%. In addition to bismuth, the soldering compound preferably contains tin and silver or tin, silver, and copper. In a particularly preferred embodiment, the soldering compound includes at least 35 wt.-% to 69 wt.-% bismuth, 30 wt.-% to 50 wt.-% tin, 1 wt.-% to 10 wt.-% silver, and 0 wt.-% to 5 wt.-% copper. In a very particularly preferred embodiment, the soldering compound contains at least 49 wt.-% to 60 wt.-% bismuth, 39 wt.-% to 42 wt.-% tin, 1 wt.-% to 4 wt.-% silver, and 0 wt.-% to 3 wt.-% copper.

In another advantageous embodiment, the soldering compound contains from 90 wt.-% to 99.5 wt.-% tin, preferably from 95 wt.-% to 99 wt.-%, particularly preferably from 93 wt.-% to 98 wt.-%. In addition to tin, the soldering compound preferably contains from 0.5 wt.-% to 5 wt.-% silver and from 0 wt.-% to 5 wt.-% copper.

The connection element according to the invention preferably contains at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, and/or 0 wt.-% to 1 wt.-% titanium. In addition, the connection element can contain admixtures of other elements, including vanadium, aluminum, niobium, and nitrogen.

The connection element according to the invention can also contain at least 66.5 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, 0 wt.-% to 2 wt.-% niobium, and/or 0 wt.-% to 1 wt.-% titanium. In addition, the connection element can contain admixtures of other elements, including vanadium, aluminum, and nitrogen.

In another preferred embodiment, the connection element according to the invention contains at least 65 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, and/or 0 wt.-% to 1 wt.-% titanium. In addition, the connection element can contain admixtures of other elements, including vanadium, aluminum, niobium, and nitrogen.

The connection element according to the invention can also contain at least 73 wt.-% to 89.5 wt.-% iron, 10.5 wt.-% to 20 wt.-% chromium, 0 wt.-% to 0.5 wt.-% carbon, 0 wt.-% to 2.5 wt.-% nickel, 0 wt.-% to 1 wt.-% manganese, 0 wt.-% to 1 wt.-% molybdenum, 0 wt.-% to 1 wt.-% niobium, and/or 0 wt.-% to 1 wt.-% titanium. In addition, the connection element can contain admixtures of other elements, including vanadium, aluminum, and nitrogen.

In another, particularly preferred embodiment, the connection element according to the invention contains at least 75 wt.-% to 84 wt.-% iron, 16 wt.-% to 18.5 wt.-% chromium, 0 wt.-% to 0.1 wt.-% carbon, 0 wt.-% to 1 wt.-% manganese, and/or 0 wt.-% to 1 wt.-% titanium. In addition, the connection element can contain admixtures of other elements, including vanadium, aluminum, niobium, and nitrogen.

The connection element according to the invention can also contain at least 78.5 wt.-% to 84 wt.-% iron, 16 wt.-% to 18.5 wt.-% chromium, 0 wt.-% to 0.1 wt.-% carbon, 0 wt.-% to 1 wt.-% manganese, 0 wt.-% to 1 wt.-% niobium, and/or 0 wt.-% to 1 wt.-% titanium. In addition, the connection element can contain admixtures of other elements, including vanadium, aluminum, and nitrogen.

The connection element according to the invention is coated, preferably, with nickel, tin, copper, and/or silver. The connection element according to the invention is particularly preferably provided with an adhesion-promoting layer, preferably made of nickel and/or copper, and, additionally, with a solderable layer, preferably made of silver. The connection element according to the invention is coated, very particularly preferably, with 0.1 μm to 0.3 μm nickel and/or 3 μm to 20 μm silver. The connection element can be plated with nickel, tin, copper, and/or silver. Nickel and silver improve the current-carrying capacity and corrosion stability of the connection element and the wetting with the soldering compound.

The connection element according to the invention contains, preferably, a chromium-containing steel with a proportion of chromium greater than or equal to 10.5 wt.-% and a coefficient of thermal expansion of $9 \times 10^{-6}/°$ C. to $13 \times 10^{-}$ 6/° C. Further alloy components such as molybdenum, manganese, or niobium result in improved corrosion stability or altered mechanical properties, such as tensile strength or cold formability.

The advantage of connection elements made of chromium-containing steel compared to connection elements according to the prior art made of titanium resides in the better solderability. It results from the higher thermal conductivity of 25 W/mK to 30 W/mK compared to the thermal conductivity of titanium of 22 W/mK. The higher thermal conductivity results in a more uniform heating of the connection element during the soldering process, by means of which the pointwise formation of particularly hot sites ("hot spots") is avoided. These sites are starting points for mechanical stresses and subsequent damage of the pane. Improved adhesion of the connection element to the pane results, in particular with the use of a leadfree soldering compound that can compensate mechanical stresses less well due to its lower ductility compared to lead-containing soldering compounds. Due to the better cold formability, the connection element can also be better formed from the chromium-containing steel. Chromium-containing steel is, moreover, more available.

A further advantage of connection elements made of chromium-containing steel resides in the high rigidity compared to many conventional connection elements, made, for example, of copper. Because of it, the connection element can be less readily deformed, for example, under load from pulling on a wire connected to the connection element. Such a deformation results in a load on the connection between a connection element and an electrically conductive structure via the soldering compound. In particular, with leadfree soldering compounds, such a load must be avoided. The load can be less well compensated as a result of the lower ductility of the leadfree soldering compound compared to lead-containing soldering compounds, which can lead to damage to the pane.

According to the invention, the connection element is implemented as a snap. Thus, the connection element can be simply and conveniently connected to a connection cable if the connection cable is provided with a complementary snap. The connecting of the connection element to the connection cable can advantageously occur after the installation of the pane at the site of use.

In a preferred embodiment, the connection element is implemented as a male snap. The connection cable is then provided with a complementary female snap. However, alternatively, the connection element can be implemented as a female snap and the connection cable can be provided with a male snap.

The connection element has at least one contact surface via which the connection element is connected, preferably over its entire surface, by means of the soldering compound to a subregion of the electrically conductive structure. The contact surface preferably has no corners. The contact surface can, for example, have an oval, elliptical, or round shape. However, alternatively, the contact surface can have a convex polygonal shape, preferably a rectangular shape, with rounded corners. The rounded corners have a radius of curvature of r>0.5 mm, preferably of r>1 mm.

The electrical connection element preferably has, at least on the surface facing the soldering compound, a coating that contains copper, zinc, tin, silver, gold, or alloys or layers thereof, preferably silver. This prevents spreading of the soldering compound out beyond the coating and limits the outflow width.

In an advantageous embodiment of the invention, spacers, preferably at least two spacers, particularly preferably at least three spacers, are arranged on the contact surface of the connection element. The spacers preferably contain the same alloy as the connection element. Each spacer is shaped, for example, as a cube, as a pyramid, as a segment of a rotational ellipsoid, or as a spherical segment. The spacers preferably have a width of $0.5 \times 10^{-4}$ m to $10 \times 10^{-4}$ m and a height of $0.5 \times 10^{-4}$ m to $5 \times 10^{-4}$ m, particularly preferably of $1 \times 10^{-4}$ m to $3 \times 10^{-4}$ m. By means of the spacers, the formation of a uniform layer of soldering compound is favored. That is particularly advantageous with regard to the adhesion of the connection element. The spacers can be formed in one piece with the connection element. The spacers can, for example, be formed by reshaping a connection element with flat contact surfaces in the initial state to the contact surface, for example, by stamping or deep drawing. In the process, a corresponding depression can be created on the surface of the connection element opposite the contact surface.

By means of the spacers, a homogeneous, uniformly thick, and uniformly fuzed layer of the soldering compound is obtained. Thus, mechanical stresses between the connection element and the pane can be reduced. This is particularly advantageous with the use of leadfree soldering compounds that can compensate mechanical stresses less well due to their lower ductility compared to lead-containing soldering compounds.

The connection elements are, in the plan view, for example, preferably 1 mm to 50 mm long and wide, and, particularly preferably 3 mm to 30 mm long and wide, and, very particularly preferably 5 mm to 10 mm long and wide.

The shape of the electrical connection element can form solder depots in the intermediate space of the connection element and the electrically conductive structure. The solder depots and wetting properties of the solder on the connection element prevent the outflow of the soldering compound from the intermediate space. The solder depots can be rectangular, rounded, or polygonal in design.

The introduction of the energy during the electrical connecting of an electrical connection element and an electrically conductive structure occurs preferably by means of punches, thermodes, piston soldering, preferably laser soldering, hot air soldering, induction soldering, resistance soldering, and/or with ultrasound.

The object of the invention is further accomplished through a method for production of a pane according to the invention with at least one connection element, wherein
a) soldering compound is applied on the connection element as a platelet,
b) an electrically conductive structure is applied on a substrate,
c) the connection element with the soldering compound is arranged on the electrically conductive structure, and
d) the connection element is soldered to the electrically conductive structure.

The soldering compound is preferably applied in advance to the connection elements, preferably as a platelet with a fixed layer thickness, volume, shape, and arrangement on the connection element.

The layer thickness of the soldering compound platelet is preferably less than or equal to 0.6 mm. The shape of the soldering compound platelet preferably corresponds to the shape of the contact surface. If, for example, the contact surface is implemented round or has a circular outer edge, the soldering compound platelet preferably has a round shape.

The connection element is preferably used in heated panes or in panes with antennas in buildings, in particular, in automobiles, railroads, aircraft, or watercraft. The connection element serves to connect the conducting structures of the pane to electrical systems that are arranged outside the pane. The electrical systems are amplifiers, control units, or voltage sources.

Figure 2:
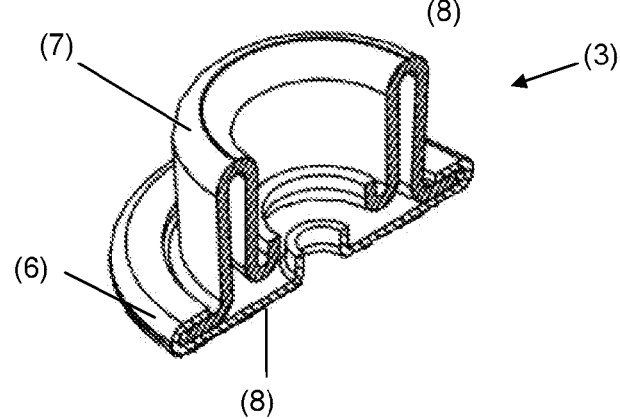
Figure 3:
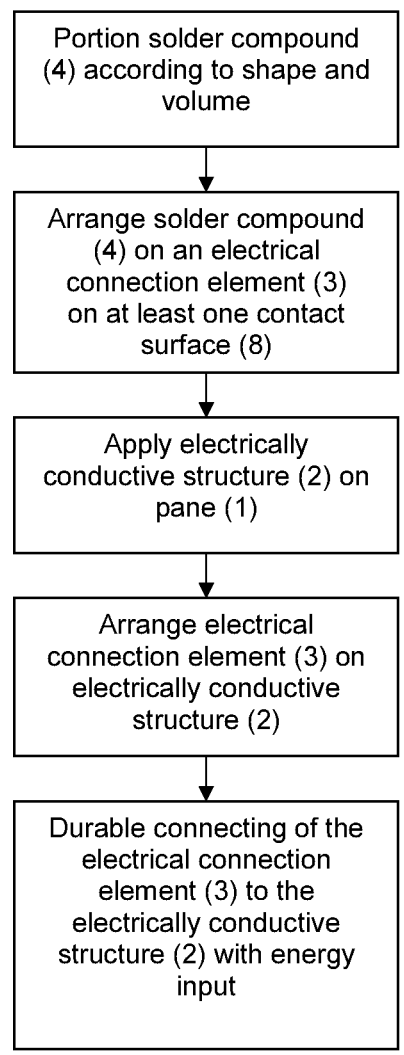

The invention is explained in detail with reference to drawings and exemplary embodiments. They depict:

FIG. 1 a cross-section through a first embodiment of the pane according to the invention, FIG. 2 a cross-section through the connection element of FIG. 1, in a perspective view, FIG. 3 a detailed flow chart of the method according to the invention.

FIG. 1 depicts a cross-section through a heatable pane 1 according to the invention in the region of the electrical connection element 3. The pane 1 is a 3-mm-thick thermally prestressed single-pane safety glass made of soda lime glass. The pane 1 has a width of 150 cm and a height of 80 cm. An electrically conductive structure 2 in the form of a heating conductor structure 2 is printed on the pane 1. The electrically conductive structure 2 contains silver particles and glass frits. In the edge region of the pane 1, the electrically conductive structure 2 is widened to a width of 10 mm and forms a contact surface for the electrical connection element 3. A covering screenprint (not shown) is also situated in the edge region of the pane 1. In the region of the contact surface 8 between the electrical connection element 3 and the electrically conductive structure 2, soldering compound 4 is applied, which effects a durable electrical and mechanical connection between the electrical connection element 3 and the electrically conductive structure 2. The soldering compound 4 contains 57 wt.-% bismuth, 40 wt.-% tin, and 3 wt.-% silver. The soldering compound 4 is arranged through a predefined volume and shape completely between the electrical connection element 3 and the electrically conductive structure 2. The soldering compound 4 has a thickness of 250 µm. The electrical connection element 3 is made of steel of the material number 1.4509 in accordance with EN 10 088-2 (ThyssenKrupp Nirosta® 4509) with a coefficient of thermal expansion of $10.0 \times 10^{-6}/°$ C. The electrical connection element 3 can have a silver coating (not shown), for example, with a thickness of roughly 5

Steel of the material number 1.4509 in accordance with EN 10 088-2 has good cold forming properties and good welding properties with all methods except gas welding. The steel is used for construction of sound suppressor systems and exhaust gas detoxification systems and is particularly suited for that due to its scaling resistance to more than 950° C. and corrosion resistance against the stresses occurring in the exhaust gas system. However, other chromium-containing steels can be used for the connection element 3. One alternative particularly suitable steel is, for example, material number 1.4016 in accordance with EN 10 088-2.

The electrical connection element 3 is implemented as a male snap. In the embodiment depicted, the electrical connection element 3 consists of a base plate 6 and a connecting element 7. In the plan view, the base plate 6 has a circular shape. The base plate 6 has, in the center, a circular hole, on the outer edge of which the base plate 6 is bent upward such that a region of the base plate extends away from the pane 1 roughly at a right angle. The outer edge of the base plate 6 bent in a U-shape. This forms a female seating in the edge region of the base plate 6 for the connecting element 7. The bent edge region of the base plate 6 can be designed continuous or discontinuous. The base plate 6, with the exception of the bent regions, is flat adjacent the hole and in the edge region. The flat surface of the base plate 6 facing the pane 1 forms the contact surface 8.

The base plate 6 has a material thickness of, for example, roughly 0.2 mm or 0.3 mm. The circular outer edge of the base plate 6 has a diameter of, for example, roughly 8 mm. The circular hole in the center of the base plate 6 has a diameter of, for example, roughly 1 mm.

The connecting element 7 is designed substantially as a hollow cylinder that is arranged substantially perpendicular to the surface of the pane 1. A foot region on the outer edge of the connecting element 7 is bent outward and extends roughly parallel to the contact surface 8 of the hollow cylinder. This foot region is inserted into the female seating that is formed by the bent region of the base plate 6. Thus, the connecting element 7 is durably stably connected to the base plate 6 of the connection element 3. The walls of the hollow cylinder are realized by a roughly U-shaped bending of the connecting element 7, with the radius of the U-shaped bend equaling, for example, roughly 0.3 mm. The hollow cylinder has an external diameter of, for example, roughly 5.7 mm and an internal diameter of, for example, roughly 3.5 mm. The material thickness of the connecting element 7 is, for example, roughly 0.3 mm. The height of the connecting element 7 is, for example, roughly 3.5 mm.

The connection element 3 is intended for and suitable for being connected to a female snap (not shown). For this purpose, the female snap is mounted on the connecting element 7. The outside wall of the hollow cylinder does not run perpendicular from the pane 1, but, instead, has an angle of, for example, roughly 3° relative to the perpendicular such that the diameter of the connecting element 7 becomes slightly larger with increasing distance from the pane 1. Thus, an unintentional slipping off of the mounted female snap is avoided. The female snap can, for example, include spring elements that exert pressure on the outside walls of the connecting element 7. A connection cable to the onboard electrical system is connected to the female snap. Thus, an electrical connection between the electrically conductive structure 2 and the external voltage source can be provided simply and conveniently.

The connecting element 7 can alternatively be provided, for example, with a groove in which a lip of the female snap engages upon mounting. If the diameter of the connecting element 7 becomes, at least in part of its height, larger with an increasing distance from the pane 1, the female snap can advantageously engage on the male snap, for example, by means of lips or spring elements.

FIG. 2 shows a cross-section through the connection element 3 of FIG. 1 in a perspective view. The connection element 3 includes the base plate 6 with the contact surface 8 and the connecting element 7.

FIG. 3 depicts in detail a method according to the invention for production of a pane 1 with an electrical connection element 3. An example of the method according to the invention for production of a pane with an electrical connection element 3 is presented there. As a first step, it is necessary to portion the soldering compound 4 according to shape and volume. The portioned soldering compound 4 is arranged on the contact surface 8 of the electrical connection element 3. The soldering compound can, for example, be formed as a circular platelet that is arranged on the contact surface of the connection element 3 of FIG. 1, with the hole in the center of the base plate 6 covered. The electrical connection element 3 is arranged with the soldering compound 4 on the electrically conductive structure 2. A durable connecting of the electrical connection element 3 to the electrically conductive structure 2 and, thus, to the pane 1 takes place with the input of energy.

EXAMPLE

Test specimens were produced with the pane 1 (thickness 3 mm, width 150 cm, and height 80 cm), the electrically conductive structure 2 in the form of a heating conductor structure, the electrical connection element 3 according to FIG. 1, and the soldering compound 4. The connection element 3 was plated with silver. The soldering compound 4 was applied in advance as a circular platelet with fixed layer thickness, volume, and shape on the contact surface 8 of the connection element 3. The connection element 3 was applied with the soldering compound 4 applied on the electrically conductive structure 2. The connection element 3 was soldered onto the electrically conductive structure 2 at a temperature of 200° C. and a processing time of 2 seconds. Outflow of the soldering compound 4 from the intermediate space between the electrical connection element 3 and the electrically conductive structure 2, which exceeded a layer thickness t of 50 μm, was observed only to a maximum outflow width of b=0.5 mm. The compositions of the electrical connection element 3 and the soldering compound 4 are found in Table 1. No critical mechanical stresses were observed in the pane 1 due to the arrangement of the soldering compound 4, predefined by the connection element 3 and the electrically conductive structure 2. The connection of the pane 1 to the electrical connection element 3 via the electrically conductive structure 2 was durably stable.

With all specimens, it was possible to observe, with a temperature difference from +80° C. to −30° C., that no glass substrate 1 broke or exhibited damage. It was possible to demonstrate that, shortly after soldering, these panes 1 with the soldered connection element 3 were stable against a sudden temperature drop.

TABLE 1

| Components | Material | Example |
| --- | --- | --- |
| Connection element 3 | Steel of material no. 1.4509 in accordance with EN 10 088-2 with the composition: | |
| | Iron (wt.-%) | 78.87 |
| | Carbon (wt.-%) | 0.03 |
| | Chromium (wt.-%) | 18.5 |
| | Titanium (wt.-%) | 0.6 |
| | Niobium (wt.-%) | 1 |
| | Manganese (wt.-%) | 1 |
| | CTE (coefficient of thermal expansion) ($10^{-6}$/° C. for 0° C.-100° C.) | 10 |
| | Difference between CTE of the connection element and substrate ($10^{-6}$/° C. for 0° C.-100° C.) | 1.7 |
| | Thermal conductivity (W/mK for 20° C.) | 25 |
| Soldering compound 4 | Tin (wt.-%) | 40 |
| | Bismuth (wt.-%) | 57 |
| | Silver (wt.-%) | 3 |
| | Thickness of the solder layer in (m) | 250 × $10^6$ |
| Glass substrate 1 (Soda lime glass) | CTE ($10^{-6}$/° C. for 0° C.-320° C.) | 8.3 |

COMPARATIVE EXAMPLE

The comparative example was carried out the same as the example. The difference resided in the use of a different material for the connection element 3. The connection element 3 was 100 wt.-% titanium. The connection element 3 thus had lower thermal conductivity, a lower coefficient of thermal expansion, and a smaller difference of the coefficients of thermal expansion between connection element 3 and substrate 1. The components of the electrical connection element 3 and the soldering compound 4 are found in Table 2. The connection element 3 was soldered to the electrically conductive structure 2 in accordance with conventional methods by means of the soldering compound 4. With the outflow of the soldering compound 4 from the intermediate space between the electrical connection element 3 and the electrically conductive structure 2, which exceeded a layer thickness t of 50 μm, an average outflow width b=2 mm to 3 mm was obtained. The lower thermal conductivity of the material for the connection element 3 resulted, in the comparative example, in a less uniform heating of the connection element during the soldering process.

With a sudden temperature difference from +80° C. to −30° C., it was observed that the glass substrates 1 exhibited major damage shortly after soldering.

TABLE 2

| Components | Material | Comparative example |
| --- | --- | --- |
| Connection element 3 | Titanium (wt.-%) | 100 |
| | CTE (coefficient of thermal expansion) ($10^{-6}$/° C. for 0° C.-100 ° C.) | 8.80 |
| | Difference between CTE of the connection element and substrate ($10^{-6}$/° C. for 0° C.-100° C.) | 0.5 |
| | Thermal conductivity (W/mK for 20° C.) | 22 |
| Soldering compound 4 | Tin (wt.-%) | 40 |
| | Bismuth (wt.-%) | 57 |
| | Silver (wt.-%) | 3 |
| | Thickness of the solder layer in (m) | 250 × $10^6$ |
| Glass substrate 1 (Soda lime glass) | CTE ($10^{-6}$/° C. for 0° C.-320° C.) | 8.3 |

The differences from Tables 1 and 2 above and the advantages of the connection element 3 according to the invention are found in Table 3.

TABLE 3

| | Embodiment according to the invention, Example | Comparative example |
| --- | --- | --- |
| Material | Steel of material no. 1.4509 in accordance with EN 10 088-2 | Titanium |
| Thermal conductivity (W/mK for 20° C.) | 25 | 22 |
| CTE (coefficient of thermal expansion) of the connection element ($10^{-6}$/° C. for 0° C.-100° C.) | 10 | 8.8 |
| Difference between CTE of the connection element and the substrate ($10^{-6}$/° C. for 0° C.-100° C.) | 1.7 | 0.5 |

It was demonstrated that panes according to the invention with glass substrates 1 and electrical connection elements 3 according to the invention had better stability against sudden temperature differences. This result was unexpected and surprising for the person skilled in the art.

LIST OF REFERENCE CHARACTERS (1) pane
(2) electrically conductive structure
(3) electrical connection element
(4) soldering compound
(5) wetting layer
(6) base plate of the electrical connection element 3
(7) connecting element of the electrical connection element 3
(8) contact surface of the connection element 3 with the electrically conductive structure 2
b maximum outflow width of the soldering compound
t limiting thickness of the soldering compound

The invention claimed is:

1. A pane with at least one electrical connection element, comprising:
    a substrate;
    an electrically conductive structure on a region of the substrate;
    a connection element that is implemented as a snap and contains chromium-containing steel; and
    a layer of a soldering compound, which electrically connects the connection element to a subregion of the electrically conductive structure,
        wherein a coefficient of thermal expansion of the connection element is from $9\times10^{-6}/°$ C. to $13\times10^{-6}/°$ C., in a temperature range from 0° C. to 300° C.

2. The pane according to claim 1, wherein the difference between the coefficient of thermal expansion of the substrate and the coefficient of thermal expansion of the connection element is $<5\times10^{-6}/°$ C.

3. The pane according to claim 1, wherein the connection element contains at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, or 0 wt.-% to 1 wt.-% titanium.

4. The pane according to claim 3, wherein the connection element contains at least 75 wt.-% to 84 wt.-% iron, 16 wt.-% to 18.5 wt.-% chromium, 0 wt.-% to 0.1 wt.-% carbon, 0 wt.-% to 1 wt.-% manganese, or 0 wt.-% to 1 wt.-% titanium.

5. The pane according to claim 1, wherein the electrically conductive structure contains silver.

6. The pane according to claim 1, wherein the layer thickness of the soldering compound is less than or equal to $6.0\times10^{-4}$ m.

7. The pane according to claim 1, wherein the soldering compound contains tin and bismuth, indium, zinc, copper, silver, or compositions thereof.

8. The pane according to claim 7, wherein the proportion of tin in the solder composition is 3 wt.-% to 99.5 wt.-% and the proportion of bismuth, indium, zinc, copper, silver, or compositions thereof is 0.5 wt.-% to 97 wt.-%.

9. The pane according to claim 1, wherein the connection element is coated with nickel, tin, copper, and or silver.

10. The pane according to claim 9, wherein the connection element is coated with 0.1 µm to 0.3 µm nickel and or 3 µm to 20 µm silver.

11. The pane according to claim 1, wherein the connection element is connected to the subregion of the electrically conductive structure via a contact surface over its entire surface.

12. The pane according to claim 11, wherein the contact surface has no corners.

13. A method for producing a pane with at least one electrical connection element, comprising:
    applying a soldering compound on a connection element as a platelet;
    applying an electrically conductive structure on a substrate;
    arranging the connection element with the soldering compound on the electrically conductive structure, wherein the connection element is implemented as a snap, contains chromium-containing steel and has a coefficient of thermal expansion from $9\times10^{-6}/°$ C. to $13\times10^{-6}/°$ C., in a temperature range from 0° C. to 300° C.; and
    soldering the connection element to the electrically conductive structure.

14. A method of using a pane with at least one electrical connection element, comprising:
    providing a pane according to claim 1; and
    installing the pane in a motor vehicle with an electrically conductive structure, being a heating conductor or an antenna conductor.

15. The pane according to claim 1, wherein the coefficient of thermal expansion of the connection element is from $10\times10^{-6}/°$ C. to $11.5\times10^{-6}/°$ C.

16. A pane with at least one electrical connection element, comprising:
    a substrate;
    an electrically conductive structure on a region of the substrate;
    a connection element implemented as a snap and contains chromium-containing steel;
    a base plate having a hole; and
    a layer of a soldering compound, which electrically connects the connection element to a subregion of the electrically conductive structure.

17. The pane according to claim 16, wherein the base plate has a circular shape, and wherein the hole is circular and in the center of the base plate.

18. The pane according to claim 16, wherein the connection element contains at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 0 wt.-% to 2 wt.-% manganese, 0 wt.-% to 2.5 wt.-% molybdenum, or 0 wt.-% to 1 wt.-% titanium.

19. A pane with at least one electrical connection element, comprising:
    a substrate;
    an electrically conductive structure on a region of the substrate;
    a connection element implemented as a snap and contains chromium-containing steel; and
    a layer of a soldering compound, which electrically connects the connection element to a subregion of the electrically conductive structure,
        wherein the soldering compound has an outflow width of less than 1 mm from an intermediate space between the connection element and the electrically conductive structure.

20. The pane according to claim 19, wherein the connection element contains at least 50 wt.-% to 89.5 wt.-% iron, 10.5 wt.-% to 20 wt.-% chromium, 0 wt.-% to 1 wt.-% carbon, 0 wt.-% to 5 wt.-% nickel, 20 wt.-% to 2 wt.-% manganese, 0 wt.-% to 2.5 wt.-% molybdenum, or 0 wt.-% to 1 wt.-% titanium.

* * * * *